(12) United States Patent
Goldstein et al.

(10) Patent No.: US 6,310,719 B1
(45) Date of Patent: Oct. 30, 2001

(54) SEMI CONDUCTOR OPTICAL AMPLIFIER

(75) Inventors: Leon Goldstein, Chaville; Jean-Yves Emery, Palaiseau; Fabienne Gaborit, Limours, all of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/410,052

(22) Filed: Oct. 1, 1999

(30) Foreign Application Priority Data

Oct. 2, 1998 (FR) .................................................. 98 12385

(51) Int. Cl.[7] .......................................................... H01S 3/00
(52) U.S. Cl. ............................................................... 359/344
(58) Field of Search ............................ 359/344; 372/43; 385/131

(56) References Cited

U.S. PATENT DOCUMENTS

| | | | |
|---|---|---|---|
| 5,151,818 | * 9/1992 | Thijs et al. | 359/344 |
| 5,363,392 | * 11/1994 | Kasukawa et al. | 372/45 |
| 5,732,179 | * 3/1998 | Caneau et al. | 385/131 |
| 5,862,166 | * 1/1999 | Anayama | 372/43 |
| 6,175,446 | * 1/2001 | Alphonse | 359/344 |

FOREIGN PATENT DOCUMENTS

| | | |
|---|---|---|
| 0 606 821 A1 | 7/1994 | (EP). |
| 2734064 | * 12/1995 | (FR) .................. G02B/6/12 |
| 401268084 | * 10/1989 | (JP) .................. H01S/3/18 |
| 8-064904 | 3/1996 | (JP). |

OTHER PUBLICATIONS

Lenz, G. et al: "Femtosecond Dynamics of the Nonlinear Anisotropy in Polarization Insensitive Semiconductor Optical Amplifiers" Applied Physics Letters, vol. 68, No. 21, May 20, 1996, pp. 2933–2935, XP0000588348.

Holtmann, CH. et al.: "Polarization Independent Bulk Active Region Semiconductor Optical Amplifiers for 1.3 μm Wavelengths" IEEE Photonics Technology Letters, vol. 8, No. 3, Mar. 1, 1996, pp. 343–345, XP000582817.

* cited by examiner

Primary Examiner—Thomas H. Tarcza
Assistant Examiner—Deandra Hughes
(74) Attorney, Agent, or Firm—Sughrue, Mion, Zinn, Macpeak & Seas, PLLC

(57) ABSTRACT

The invention relates to a semi-conductor optical amplifier insensitive to the polarization of light. The active layer (20) of this amplifier is made up of an alternating series of solid sub-layers alternately under tensile stress (21) and compressive stress (22) and having the same forbidden band-width. The sub-layers under tensile stress (21) favour the propagation of the TM mode of polarization of light and the sub-layers under compression (22) favour the propagation of the TE mode of polarization of light. In addition, the thicknesses of the sub-layers have values which ensure equal gains G(TE) and G(TM) for the active layer.

6 Claims, 2 Drawing Sheets

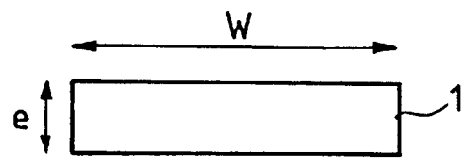
FIG_1
PRIOR ART
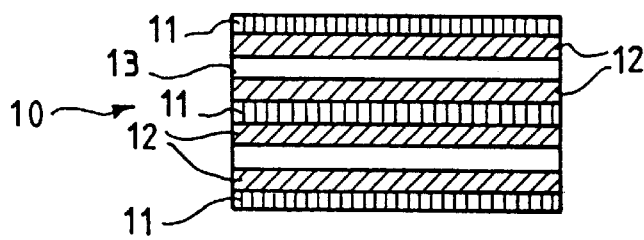
FIG_2
PRIOR ART
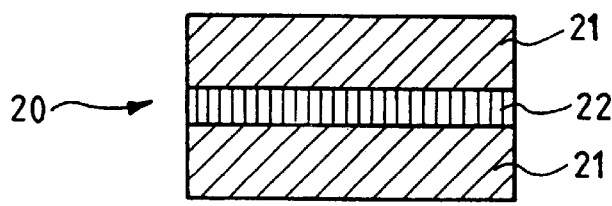
FIG_4
FIG_5
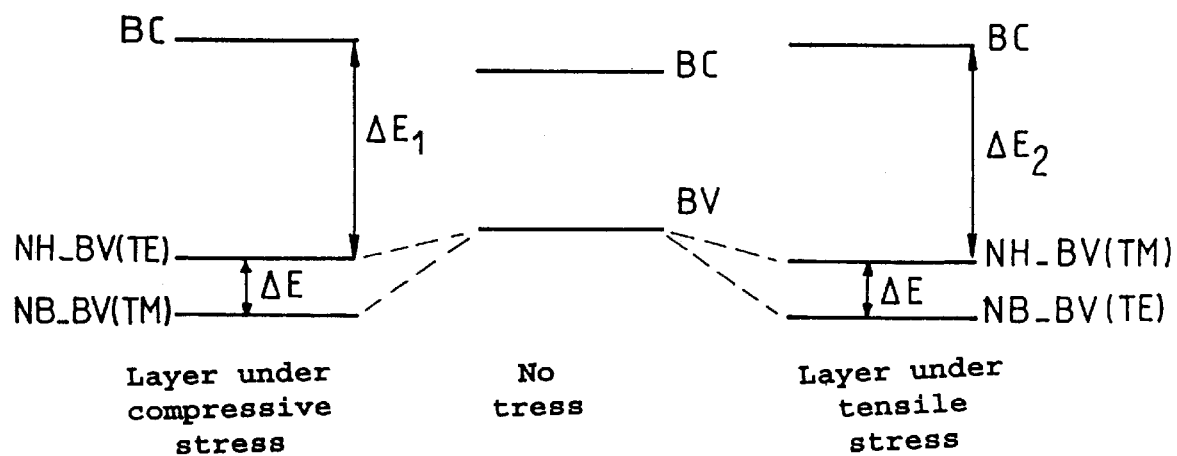

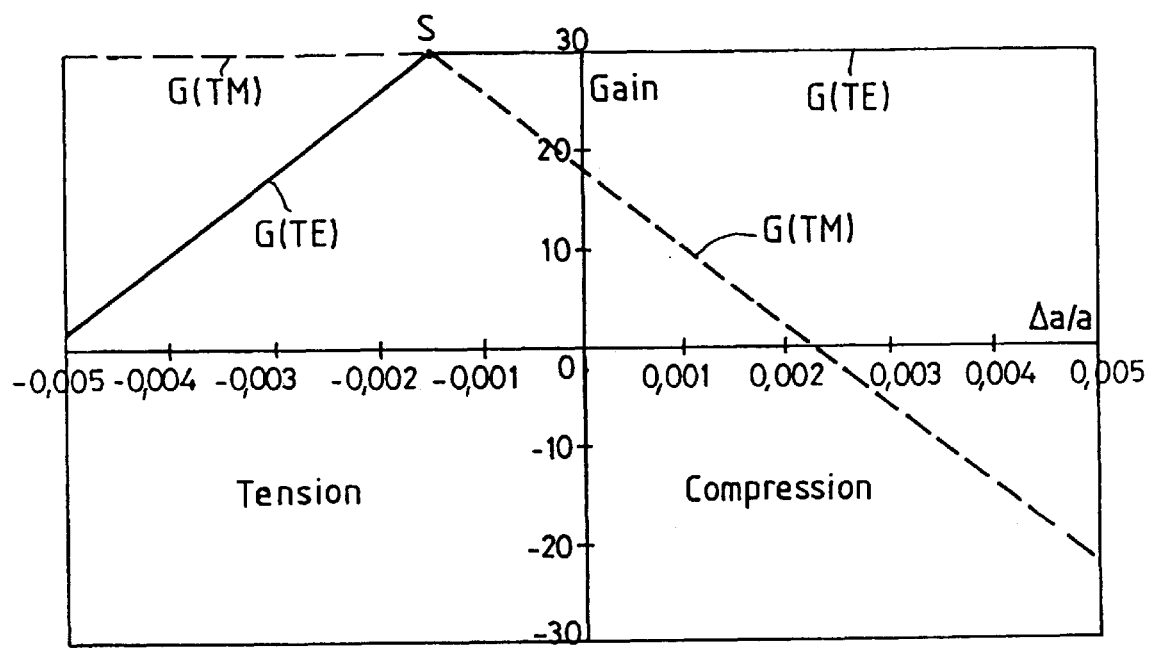
FIG_3

SEMI CONDUCTOR OPTICAL AMPLIFIER

BACKGROUND OF THE INVENTION

The present invention applies to a semi-conductor optical amplifier insensitive to polarization of light and offering good performance. In particular, it has high gain, high signal-to-noise ratio and a high confinement factor.

Semi-conductor optical amplifiers, insensitive to polarization of light, are currently manufactured by a number of different methods. Along these methods, two in particular have been used recently because their theoretical results appeared promising.

A first method consists in growing on a substrate in III–V material, of InP type for instance, an active layer of rectangular section. The material of this active layer is furthermore chosen so that it is subject to a slight tensile stress. To this end, its mesh parameter is slightly lower than the mesh parameter of the substrate.

FIG. 1 is a diagrammatic representation of this active layer rectangular section. FIG. 3 shows the variation of the gain G (in dB decibels) of the active layer 1 of the amplifier depending on the various modes TE (in solid lines) and TM (in dotted lines) of polarization of the light, depending on the stresses $\Delta a/a$. The gain G of the active layer is proportional to the product $g \times \Gamma$ where g represents the gain of the gain specific to the constituent material of the active layer, and $\Gamma$ represents the confinement factor. In this method of production, the constituent material of the active layer is subject to slight tension. Typically, the tension $\Delta a/a$ is of the order of $-1.6 \times 10^{-3}$.

However, a slight variation of the tensile stress $\Delta a/a$ causes a large variation of the gain G of the active layer. On the curve of FIG. 3, it can be seen that if a variation in gain of less than a dB is desired, the variation in stress $\Delta a/a$ must be less than $1.10^{-4}$. Now a degree of precision such as this of the tensile stress to be applied to the material of the active layer 1 is not easy to control. Furthermore, since the stress applied in the active layer 1 is a tensile stress $\Delta a/a$, the gain G(TM) of this active layer, in the TM mode of polarization of light, is greater than the gain G(TE) in the TE mode of polarization of light. It is therefore very difficult to control the variations in gain G of the active layer of the amplifier. It consequently appears very difficult to balance the gains G(TE) and G(TM) of the active layer by controlling the tensile stress.

Additionally, the thickness of the section of the active layer 1 plays an important part with regard to the confinement factors $\Gamma$ since it enables the ratio $\Gamma(TE)/\Gamma(TM)$ to be controlled. In the example in FIG. 1, this thickness is for example 300 nm, while the width w of the section is for example 1,000 nm. In fact, the rectangular shape of the section of the active layer enables a higher confinement factor $\Gamma$ to be obtained in TE mode than in TM mode.

From the relationships $G(TM)=g(TM)\times\Gamma(TM)$ and $G(TE)=g(TE)\times\Gamma(TE)$, and the fact that the slight tensile stress creates a gain, in the material of the active layer, such that $g(TM)>g(TE)$ and that the shape of the active layer gives a confinement factor such that $\Gamma(TE)>\Gamma(TM)$, it suffices to adjust the shape of the section, and in particular its thickness, and the tensile stress in the material, to cause variations in the parameters g(TE), g(TM), $\Gamma$(TE) and $\Gamma$(TM) in such a way as to obtain equality between the gains G(TE) and G(TM) of the amplifier. This equality between the gains G(TE) and G(TM) of the amplifier makes it possible to make the amplifier insensitive to the polarization of light.

However, the thickness of the active layer is also very difficult to control with precision. Generally it is not possible to control an absolute thickness at better than 2%. This 2% margin of error therefore also leads to a margin of error, which cannot be controlled, in the confinement factors $\Gamma$(TE) and $\Gamma$(TM).

Since the variations of gains in the material of the active layer g(TE) and g(TM), and the confinement factors $\Gamma$(TE) and $\Gamma$(TM) are difficult to control, it follows that it is very difficult to balance the gains G(TE) and G(TM) in order to make the amplifier insensitive to the polarization of light. This first method does not therefore, in practice, enable satisfactory results to be obtained reproducibly.

A second method consists in growing on a substrate in III–V material, of InP type for instance, an active layer with a quantum well structure. A section of this active layer 10 is diagrammatically represented in FIG. 2. The quantum structure consists of a series of very thin layers with quantum wells 11,12, alternately stressed in compression 11 and tension 12, and barrier layers constituted by a material with a broad band of forbidden energy and a low refractive index.

In this case, the tensile and compressive stresses are high. The tensile stresses $\Delta a/a$ are less than $-6.10^{-3}$ and the compressive stresses $\Delta a/a$ are greater than $+6.10^{-3}$. In this case, the layers under tensile stress have a gain g(TE) inherent in the material of which they are constructed which is negligible by comparison with their gain g(TM). Conversely, the layers under compressive stress have a gain g(TM) inherent in the material of which they are constructed which is negligible by comparison with the r gain g(TE) The active layer of the amplifier constructed according Lo this second method thus has an alternation of very thin layers with quantum wells which are purely TE or purely TM, i.e. the layers with quantum wells each allow the propagation of only one of the modes TE and TM of polarization of light.

Since the overall gain G of the active layer of the amplifier is proportional to the product $g\times\Gamma$, all that remains is to vary the confinement factors $\Gamma$(TE) and $\Gamma$(TM) of the different layers to balance the gains G(TE) and G(TM)in order to make the amplifier insensitive to the polarization of light. To this end it is necessary to adjust the number of quantum wells in the layers, i.e. it is necessary to control the ratio of the thicknesses of the different layers. The control of a ratio of thicknesses can be carried out with greater precision than the control of absolute thickness. It thus appears that the confinement factors can be adjusted more readily than in the case of the previously described method.

However, in this second previously known method of construction, the different layers are very thin, generally between 6 and 12 nm. This thinness of the layers means that low confinement factors $\Gamma$(TE) and $\Gamma$(TM) are obtained. Now it is important, in order to obtain high efficiency, that semi-conductor optical amplifiers should have high confinement factors. To increase the value of these confinement factors $\Gamma$(TE) and $\Gamma$(TM) it is necessary to multiply the number of quantum wells and of barriers 13. This multiplication, however, leads to other problems, in particular problems of an electrical nature, because the injection current becomes non-uniform between the wells.

Furthermore, to form the quantum structure of the active layer 10, it is necessary to grow three different types of material: a first type to form the layers with quantum wells under tensile stress 12, a second type to form the layers under compressive stress 11, and a third type to form the barrier layers 13. Now the process of growing three different types of material to form a succession of very thin layers is difficult to control with precision and complex to set up. Consequently, amplifiers manufactured using this second method do not always in practice give the hoped-for results.

SUMMARY OF THE INVENTION

The present invention makes it possible to remedy the above-mentioned disadvantages since it proposes a semi-conductor optical amplifier insensitive to polarization of light and having a high confinement factor whatever the mode TE or TM of polarization of the light. To this end, the active layer of the amplifier according to the invention has a non-quantum vertical structure consisting of a series of sub-layers the gain g of which is purely TE or purely TM and the thicknesses of which have values which ensure a balance of the gains G(TE) and G(TM) of the active layer.

The invention applies more particularly to a semi-conductor optical amplifier comprising an active layer deposited on a substrate in III–V material, characterised in that the said active layer is made up of a succession of bulk sub-layers alternately subject to tensile stress and compressive stress, the said sub-layers having the same forbidden energy bandwidth; in that the sub-layers under tensile stress favour the propagation of the TM mode of polarization of light, and the sub-layers under compressive stress favour the propagation of the TE mode of polarization of light; and in that the thicknesses of the sub-layers have values which ensure equal gains G(TE) and G(TM) for the active layer.

According Lo another characteristic of the invention, the thickness of the sub-layers is greater than 30 nm and less than 100 nm.

According to another characteristic of the invention, the thickness of the sub-layers under tensile stress is greater than the thickness of the sub-layers under compressive stress.

According to yet another characteristic of the invention the sub-layers are made in a quaternary material the composition of which is different depending on whether the said sub-layers are under tensile or compressive stress.

According to yet another characteristic the quaternary material of the sub-layers is InGaAsP or AlGaInAs.

According to yet another characteristic of the invention, the tensile stresses lie between $-3.10^{-3}$ and $-1.10^{-2}$ and the compressive stresses are between $+3.10^{-3}$ and $+1.10^{-2}$.

BRIEF DESCRIPTION OF THE INVENTION

Other distinctive features and advantages of the invention will appear on reading the description given as an illustrative example and which refers to the appended Figures, which represent:

FIG. 1, already described, the section of the active layer of an optical amplifier according to the first method of production of the prior state of the art, FIG. 2, already described, the section of the active layer of an optical amplifier according to the second method of production of the prior state of the art, FIG. 3, curves representing the variation in overall gain G(TE) and G(TM) of the active layer of the amplifier, in accordance with the different modes of polarization of the light, depending on the tensile or compressive stresses applied to all the sub-layers making up the active layer, FIG. 4, a diagram of the section of the active layer of an optical amplifier according to the invention, FIG. 5, a diagram of energies corresponding to sub-layers making up the active layer of an optical amplifier according to the invention respectively under compressive and tensile stress.

DETAILED DESCRIPTION OF THE INVENTION

The structure of the active layer 20 of a semi-conductor optical amplifier according to the invention is schematically shown in section in FIG. 4. This active layer 20 is deposited on a substrate in III–V material, InP for example, not shown in FIG. 4. This structure is not a structure with multiple quantum wells. The active layer 20 is made up of a series of bulk sub-layers 21, 22 which are alternately subject to tensile stress 21 and compressive stress 22.

The values of the stresses $\Delta a/a$ in tension and compression are selected to be moderate but sufficient to ensure that the sub-layers can be considered as being alternately purely TE and purely TM, i.e. that they alternately favour the propagation of a single mode TE or TM of polarization of light. Furthermore, the sub-layers 21 and 22 are deposited in considerable thicknesses, typically greater than or equal to 30 nm. In view of these high values of thickness, it is preferable to select moderate values in tension and in compression. This is because layers as thick as this do not withstand stresses $\Delta a/a$ which are too high, which may lead to the formation of dislocations which are harmful to the crystalline quality of the layers. Typically the tensile stresses are thus preferably selected between $-3.10^{-3}$ and $-1.10^{-2}$ and the compressive stresses are preferably selected between $+3.10^{-3}$ and $+1.10^{-2}$.

In this case, the sub-layers under tension 21 are considered as purely TM since the gain g(TE) inherent in the material of which they are constructed is negligible by comparison with the gain g(TM). Conversely, the sub-layers under compression 22 are considered as purely TE because the gain g(TM) inherent in the material of which they are made is negligible by comparison with the gain g(TE). The active layer is consequently made up of an alternating series of sub-layers considered as purely TE and of sub-layers considered as purely TM.

Since thick layers do not accept strong stresses $\Delta a/a$ without the risk of their being damaged by the occurrence of dislocations, there is a critical thickness which must not be exceeded. This critical thickness is 100 nm. Consequently, the sub-layers 21, 22 making up the active layer 20 of the amplifier according to the invention each have a thickness of between 30 and 100 nm.

Furthermore, since the structure of the active layer is not a structure with multiple quantum wells, the presence of barrier sub-layers, which have the disadvantage that they do not amplify the light wave passing through them, is not necessary. The absence of barrier sub-layers thus makes it possible to obtain more confined sub-layers under tension 21 and compression 22, so that the amplifier according to the invention has confinement factors $\Gamma(TE)$ and $\Gamma(TM)$ which are higher than those of the prior state of the art as previously described.

The material used for the successive layers is a quaternary material the composition of which varies depending on whether the sub-layers are under tensile or compressive stress, the said composition affecting the mesh parameter of the material. The quaternary material used is for example InGaAsP or AlGaInAs. Furthermore, the quaternary material, although it has a different composition depending on the type of stress to which the sub-layers are subjected, always has the same wavelength which is identical, and equal, for example, to 1.55 $\mu$m.

Since the gains inherent in the sub-layers alternately stressed in tension and in compression are respectively purely TM (g (TM)) and purely TE (g(TE)), they are identical (as illustrated in FIG. 3). However, if the sub-layers under tension 21 are of the same thickness as the sub-layers under compression 22, the confinement factors Γ(TE) and Γ(TM) are not balanced, and in particular it is found that Γ(TM) is lower than Γ(TE). Consequently, in this case, the gains G(TE) and G(TM) of the amplifier are also not balanced and the result is G(TE)=g(TV)×Γ(TE)>G(TM)=g(TM)×Γ(TM). To compensate for this lack of balance between the confinement factors, and thus between the gains of the active layer of the amplifier, the thickness of the sub-layers 21 and 22 must be controlled.

These thicknesses are precisely controlled by the control of the ratio of thicknesses between the sub-layers under tension 21 and the sub-layers under compression 22. This control of the ratio of thicknesses makes it possible to vary the confinement factors Γ(TE) and Γ(TM) and consequently to balance the gains G(TE) and G(TM) of the active layer of the amplifier according to the invention.

The thickness of the sub-layers under tension 21 must therefore be greater than the thickness of the sub-layers under compression 22, and it is selected so that the overall tension of the active layer is equal to $-1.6.10^{-3}$. This value of overall tension allows the confinement factors and the gains G(TE) and G(TM) of the active layer to be balanced, and makes it possible to obtain an amplifier which is insensitive to the polarization of light. This balance between the gains G(TE) and G(TM) is shown as the point S in FIG. 3.

Thus, to balance the gains G(TE) and G(TM) of the active layer 20, the specialist will select the thicknesses of the different sub-layers 21 and 22 so that they lie between 30 and 100 nm, and will control their ratio to obtain an overall tension in the active layer equal to $-1.6.10^{-3}$.

The semi-conductor optical amplifier thus obtained is thus insensitive to the polarization of light, it has high gain, a high confinement factor and a low cost price. Thanks to the periodic structure of the active layer and to the considerable thicknesses of the sub-layers, the ratio of the thicknesses is relatively easy to control. Furthermore, since the stresses Δa/a applied in the sub-layers are moderate, it is not necessary for them to be precisely controlled, since the sub-layers remain purely TE or purely TM even if there is a slight variation in these stresses.

Furthermore, since the structure of the active layer of the amplifier according to the invention is periodic, as against prior structures, it is much easier to inspect it by the techniques of X-ray characterization.

FIG. 5 shows the band structure of the sub-layers under tension and compression. When a stress is introduced into a material, the degeneration of the valency band BV of the material is raised. The valency band thus possesses a high level NH-VB and a low level NB-BV.

In the case of the sub-layers under compression, the fundamental level (high level of the valency band NH-BV) corresponds to the TE mode of polarization of light and the other level (NB-BV) corresponds to the TM mode of polarization of light. When the energy difference ΔE between these two levels is sufficient, i.e. when this energy difference ΔE is typically greater than 60 mev, the gain takes place only on the fundamental level, which means that the inherent gain of the material of the layer under compression will be TE. This is because in this case, the low level (NB-BV) is practically not occupied by the holes, so that the gain g(TM) under the TM mode of polarization is negligible as against the gain g(TE). Consequently, when the energy difference between the two levels TE and TM of the valency band of a sub-layer is sufficient, i.e. greater than 60 mev, it may be considered that the inherent gain g of the sub-layer is purely g(TE). This energy diagram is a good confirmation of the observations previously described and of the curves of FIG. 3.

In the case of the sub-layers under tension, the converse is true, that is, the fundamental level (high level of the valency band NH-BV) corresponds to the TM mode of polarization and the other level (NB-BV) corresponds to the TE mode of polarization of light. Consequently, when the energy difference between these two levels is sufficient, typically greater than 60 mev, the fundamental level ((NH-BV), corresponding to the TM mode, is occupied by the holes, while the other level, (NB-BV), corresponding to the TE mode, is practically not so occupied. It may therefore be considered, in this case, that the inherent gain of the layer under tension is purely TM, since g(TE) is negligible as against g(TM).

In addition, the width of the forbidden energy band $\Delta E_1$ between the conduction band BC and the valency band BV, of the sub-layers under compression must be identical with the width of the forbidden energy band $\Delta E_2$ between the conduction band BC and the valency band BV of the sub-layers under tension.

What is claimed is:

1. A semi-conductor optical amplifier comprising an active layer deposited on a substrate of III-V material, said active layer comprising a plurality of bulk sub-layers without quantum wells which are alternately subject to tensile stress and compressive stress and have the same forbidden energy bandwidth, wherein the sub-layers under tensile stress permit the propagation of the TM mode of polarization of light, the sub-layers under compressive stress permit the propagation of the TE mode of polarization of light, and thicknesses of the sub-layers are values which ensure equal gains G(TE) and G(TM) for the active layer.

2. An amplifier according to claim 1, wherein the thickness of the sub-layers are greater than 30 nm and less than 100 nm.

3. An amplifier as in claim 1, wherein the thickness of the sub-layers under tensile stress is greater than thickness of the sub-layers under compressive stress.

4. An amplifier as in claim 1, wherein the sub-layers are made of a quaternary material having different compositions depending on whether the sub-layers are under tensile or compressive stress.

5. An amplifier according to claim 4, wherein the quaternary material is InGaAsP or AlGaInAs.

6. An amplifier according to claim 1, wherein the tensile stress is a value between $-3\times10^{-3}$ and $-1\times10^{-2}$, and the compressive stresses lie between $+3\times10^{-3}$ and $+1\times10^{-2}$.

* * * * *